US012795969B2

(12) United States Patent
Sasaki et al.

(10) Patent No.: US 12,795,969 B2
(45) Date of Patent: Nov. 10, 2026

(54) SEMICONDUCTOR DEVICE AND METHOD FOR MANUFACTURING SEMICONDUCTOR DEVICE

(71) Applicant: SUMITOMO ELECTRIC DEVICE INNOVATIONS, INC., Kanagawa (JP)

(72) Inventors: Atsuya Sasaki, Kanagawa (JP); Yukinori Nose, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 363 days.

(21) Appl. No.: 18/545,295

(22) Filed: Dec. 19, 2023

(65) Prior Publication Data

US 2024/0213355 A1 Jun. 27, 2024

(30) Foreign Application Priority Data

Dec. 26, 2022 (JP) ................................. 2022-208886

(51) Int. Cl.
*H10D 30/01* (2025.01)
*H10D 30/47* (2025.01)
*H10D 62/85* (2025.01)

(52) U.S. Cl.
CPC ......... *H10D 30/015* (2025.01); *H10D 30/475* (2025.01); *H10D 62/8503* (2025.01)

(58) Field of Classification Search
CPC .. H10D 62/8503; H10D 64/256; H10D 64/62; H10D 64/647; H10D 64/649; H10D 30/47–485; H10D 30/015; H10D 62/149
See application file for complete search history.

(56) References Cited

U.S. PATENT DOCUMENTS

| | | | | |
|---|---|---|---|---|
| 5,606,184 A * | 2/1997 | Abrokwah | H10D 30/015 257/E27.059 |
| 2005/0258451 A1 | 11/2005 | Saxler et al. | |
| 2010/0006894 A1* | 1/2010 | Ohta | H10D 62/824 257/E29.091 |
| 2013/0248874 A1* | 9/2013 | Kuraguchi | H10D 30/47 257/76 |
| 2014/0014966 A1* | 1/2014 | Tabatabaie | H10D 62/149 257/E29.089 |

(Continued)

FOREIGN PATENT DOCUMENTS

| | | |
|---|---|---|
| JP | 2019-033155 | 2/2019 |
| JP | 2019-041113 | 3/2019 |
| JP | 2021-086852 | 6/2021 |

*Primary Examiner* — Scott B Geyer
(74) *Attorney, Agent, or Firm* — IPUSA, PLLC

(57) ABSTRACT

A semiconductor device includes a first nitride semiconductor layer having a first surface, and a first recess formed in the first surface, a second nitride semiconductor layer provided inside the first recess, a first insulating film, covering the first nitride semiconductor layer and the second nitride semiconductor layer, and having a first opening exposing at least a portion of the second nitride semiconductor layer, and an interconnect layer making ohmic contact with the second nitride semiconductor layer through the first opening. The second nitride semiconductor layer has a second surface opposing the interconnect layer. A second recess, continuous with the first opening, is formed in the second surface. The interconnect layer makes direct contact with the second nitride semiconductor layer at an inner surface of the second recess.

14 Claims, 15 Drawing Sheets

(56) References Cited

U.S. PATENT DOCUMENTS

| | | | | |
|---|---|---|---|---|
| 2014/0332865 | A1* | 11/2014 | Haematsu | H10W 74/147 257/288 |
| 2014/0349449 | A1* | 11/2014 | Basu | H10D 30/475 438/172 |
| 2017/0054015 | A1* | 2/2017 | Nakata | H10D 30/475 |
| 2018/0026106 | A1* | 1/2018 | Yeh | H10D 64/118 257/76 |
| 2019/0043978 | A1 | 2/2019 | Makabe | |
| 2019/0097034 | A1* | 3/2019 | Nakata | H10D 30/475 |
| 2019/0165130 | A1* | 5/2019 | Yoshida | H10D 30/015 |
| 2019/0194796 | A1 | 6/2019 | Fujioka et al. | |
| 2020/0144386 | A1* | 5/2020 | Kanda | H10D 62/85 |
| 2020/0251522 | A1* | 8/2020 | Then | H10D 30/475 |
| 2020/0287012 | A1* | 9/2020 | Murakami | H10D 30/668 |
| 2020/0357905 | A1* | 11/2020 | Lu | H10D 64/251 |
| 2020/0388701 | A1* | 12/2020 | Hickman | H10D 64/411 |
| 2021/0013307 | A1* | 1/2021 | Moon | H10D 62/824 |
| 2021/0151595 | A1* | 5/2021 | Park | H10D 30/477 |
| 2021/0159328 | A1 | 5/2021 | Yoshida | |
| 2022/0189947 | A1* | 6/2022 | Huang | H10D 64/258 |
| 2022/0406905 | A1* | 12/2022 | Huang | H10D 30/475 |
| 2023/0049363 | A1* | 2/2023 | Tsuji | H10D 30/6738 |
| 2023/0187529 | A1* | 6/2023 | Kawashima | H10D 30/015 257/183 |
| 2023/0369437 | A1* | 11/2023 | Kato | H10D 62/85 |
| 2023/0387234 | A1* | 11/2023 | Byeon | H10D 30/6735 |
| 2024/0097004 | A1* | 3/2024 | Yang | H10D 30/015 |
| 2024/0162298 | A1* | 5/2024 | He | H10D 30/015 |
| 2024/0162299 | A1* | 5/2024 | Buckley | H10D 30/475 |
| 2024/0213334 | A1* | 6/2024 | Lai | H10D 64/118 |
| 2024/0243177 | A1* | 7/2024 | Kim | H10D 64/513 |

* cited by examiner

SEMICONDUCTOR DEVICE AND METHOD FOR MANUFACTURING SEMICONDUCTOR DEVICE

CROSS-REFERENCE TO RELATED APPLICATIONS

This application is based upon and claims priority to Japanese Patent Application No. 2022-208886, filed on Dec. 26, 2022, the entire contents of which are incorporated herein by reference.

TECHNICAL FIELD

The present disclosure relates to semiconductor devices, and methods for manufacturing semiconductor devices.

BACKGROUND

There is a known semiconductor device having a high electron mobility transistor (HEMT), formed with an opening in a barrier layer and a channel layer, and provided with a gallium nitride ($n^+GaN$) layer including a high concentration of an n-type impurity in the opening. An electrode layer for ensuring an ohmic contact is provided between the $n^+GaN$ layer and an interconnect layer. The electrode layer is a laminate a titanium (Ti) layer or a tantalum (Ta) layer and an aluminum (Al) layer.

Related art includes Japanese Laid-Open Patent Publication No. 2019-033155, Japanese Laid-Open Patent Publication No. 2019-041113, U.S. Patent Application Publication No. US 2005/0258451 A1, and Japanese Laid-Open Patent Publication No. 2021-086852, for example.

In recent years, there are demands to further reduce the size of semiconductor devices.

SUMMARY

One object of the present disclosure is to provide a semiconductor device having a size that can be reduced, and a method for manufacturing such a semiconductor device.

According to one aspect of the embodiments of the present disclosure, a semiconductor device includes a first nitride semiconductor layer having a first surface, and a first recess formed in the first surface; a second nitride semiconductor layer provided inside the first recess; a first insulating film, covering the first nitride semiconductor layer and the second nitride semiconductor layer, and having a first opening exposing at least a portion of the second nitride semiconductor layer; and an interconnect layer making ohmic contact with the second nitride semiconductor layer through the first opening, wherein the second nitride semiconductor layer has a second surface opposing the interconnect layer, a second recess, continuous with the first opening, is formed in the second surface, and the interconnect layer makes direct contact with the second nitride semiconductor layer at an inner surface of the second recess.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
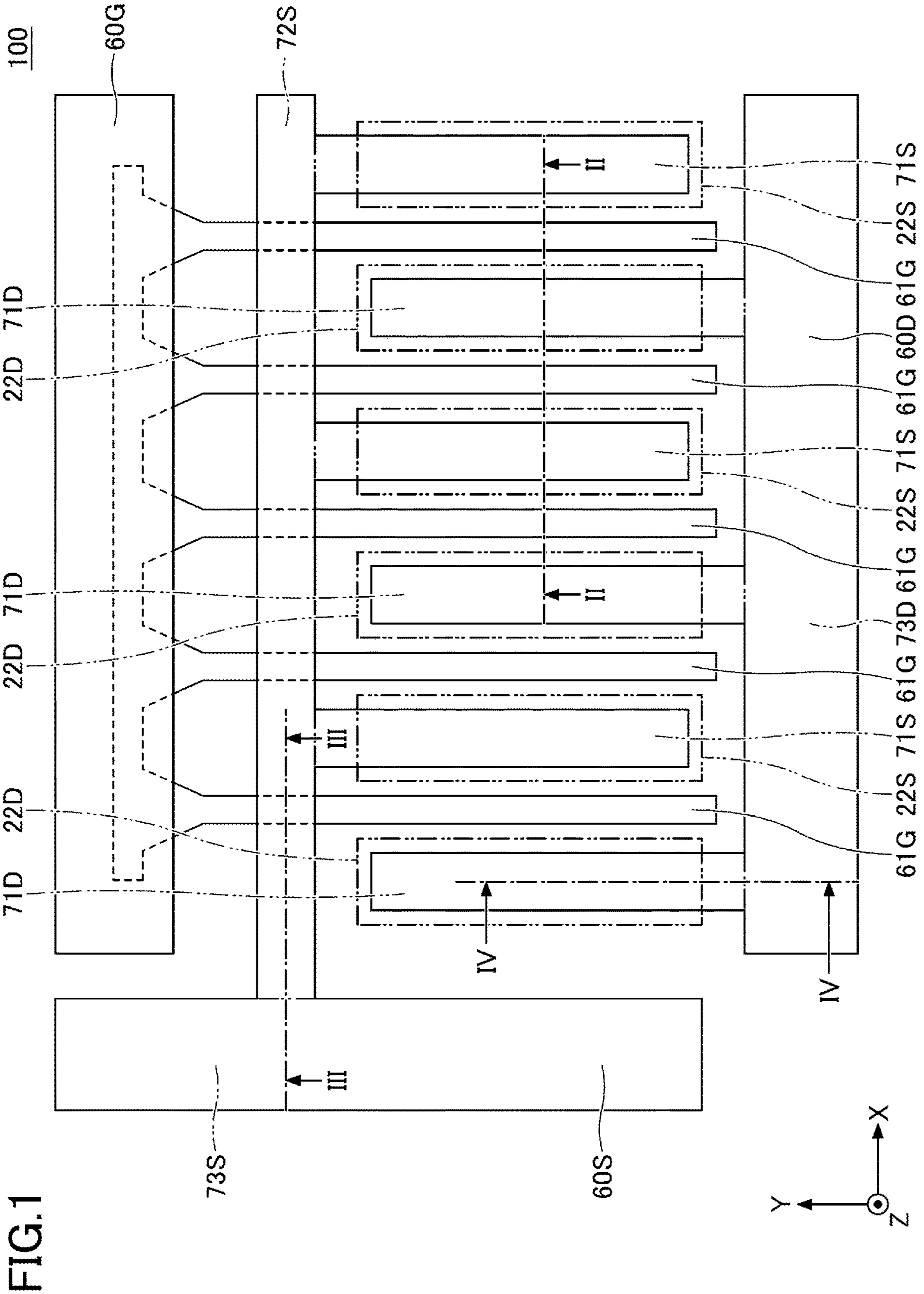
FIG. 1 is a diagram illustrating a layout of electrodes and pads of a semiconductor device according to one embodiment.

A description will hereinafter be given of embodiments of the present disclosure with reference to the drawings.

[1] A semiconductor device according to one aspect of the present disclosure includes a first nitride semiconductor layer having a first surface, and a first recess formed in the first surface; a second nitride semiconductor layer provided inside the first recess; a first insulating film, covering the first nitride semiconductor layer and the second nitride semiconductor layer, and having a first opening exposing at least a portion of the second nitride semiconductor layer; and an interconnect layer making ohmic contact with the second nitride semiconductor layer through the first opening, wherein the second nitride semiconductor layer has a second surface opposing the interconnect layer, a second recess, continuous with the first opening, is formed in the second surface, and the interconnect layer makes direct contact with the second nitride semiconductor layer at an inner surface of the second recess.

Although the second nitride semiconductor layer is locally damaged when the first opening is formed in the first insulating film, the damaged portion is removed when the second recess is formed. For this reason, an excellent ohmic contact is obtained between the interconnect layer and the second nitride semiconductor layer. In addition, because an electrode layer or the like for ensuring the ohmic contact is not required between the second nitride semiconductor layer and the interconnect layer, a margin between the second nitride semiconductor layer and the interconnect layer can be reduced, and the size of the semiconductor device can be reduced.

[2] In the semiconductor device according to [1] above, the interconnect layer may include a first metal layer making direct contacting with the second nitride semiconductor layer at a side surface and a bottom surface of the second recess, and a second metal layer, laminated on the first metal layer, and having an electrical resistance lower than an electrical resistance of the first metal layer. In this case, it is easy to obtain an excellent conductivity of the interconnect layer, while obtaining an excellent adhesion between the interconnect layer and the first insulating film.

[3] In the semiconductor device according to [2] above, the second metal layer may be a gold layer. In this case, a particularly excellent conductivity can easily be obtained.

[4] The semiconductor device according to [2] or [3] above may further include a passivation film, covering the interconnect layer, and having a second opening exposing a portion of the interconnect layer, wherein the interconnect layer includes the first metal layer and the second metal layer in a region overlapping the second opening in a plan view perpendicular to the first surface. In this case, the margin between the second nitride semiconductor layer and the interconnect layer can easily be reduced.

[5] The semiconductor device according to any one of [1] to [4] above may further include a second insulating film, provided between the first nitride semiconductor layer and the first insulating film, and having a third opening exposing the first recess. In this case, the first nitride semiconductor layer can easily be protected by the second insulating film.

[6] In the semiconductor device according to any one of [1] to [5] above, a carrier concentration in the second nitride semiconductor layer may be higher than a carrier concentration in the first nitride semiconductor layer. In this case, an electrical resistance can easily be reduced.

[7] The semiconductor device according to any one of [1] to [6] above may further include a gate electrode provided between the first nitride semiconductor layer and the first insulating film. In this case, a potential of a channel region included in the first nitride semiconductor layer can be controlled by the gate electrode.

[8] In the semiconductor device according to any one of [1] to [7] above, the second recess may have a depth in a range greater than or equal to 5 nm and less than or equal to 50 nm. In this case, a damaged portion can easily be removed, and a processing time required to form the second recess can easily be reduced.

[9] In the semiconductor device according to any one of [1] to [3] above, the first opening may expose an entirety of the second surface from the first insulating film. In this case, an excellent ohmic contact can be obtained between the second nitride semiconductor layer and the interconnect layer.

[10] A method for manufacturing a semiconductor device according to another aspect of the present disclosure, includes forming a first recess in a first surface of a first nitride semiconductor layer; forming a second nitride semiconductor layer inside the first recess; forming a first insulating film covering the first nitride semiconductor layer and the second nitride semiconductor layer; forming a first opening in the first insulating film, the first opening exposing at least a portion of the second nitride semiconductor layer; forming an interconnect layer making ohmic contact with the second nitride semiconductor layer through the first opening, wherein the second nitride semiconductor layer has a second surface opposing the interconnect layer; and forming a second recess, continuous with the first opening, in the second surface between the forming the first opening and the forming the interconnect layer, wherein the interconnect layer makes direct contact with the second nitride semiconductor layer at a side surface and a bottom surface of the second recess.

Although the second nitride semiconductor layer is locally damaged when the first opening is formed in the first insulating film, the damaged portion is removed when the second recess is formed. For this reason, an excellent ohmic contact is obtained between the interconnect layer and the second nitride semiconductor layer. In addition, because an electrode layer or the like for ensuring the ohmic contact is not required between the second nitride semiconductor layer and the interconnect layer, a margin between the second nitride semiconductor layer and the interconnect layer can be reduced, and the size of the semiconductor device can be reduced.

[11] In the method for manufacturing the semiconductor device according to [10] above, the forming the second recess may include forming an oxide layer on a portion of the second surface exposed from the first opening, and removing the oxide layer. In this case, the damaged portion can easily be removed.

[12] In the method for manufacturing the semiconductor device according to [10] or [11] above, the forming the first opening may expose an entirety of the second surface from the first insulating film. In this case, an excellent ohmic contact can be obtained between the second nitride semiconductor layer and the interconnect layer.

[Details of Embodiments of Present Disclosure]

Hereinafter, embodiments of the present disclosure will be described in detail, but the present disclosure is not limited to the described embodiments. In the present specification and the drawings, constituent elements having substantially the same functional configuration are designated by the same reference numerals, and a redundant description thereof may be omitted. In the following description, an XYZ orthogonal coordinate system is used, but this coordinate system is merely defined for the sake of convenience of description, and does not limit an orientation of the semiconductor device in any way. Further, when viewed from an arbitrary point, a +Z-side may be referred to as upward, upper side, or up, and a −Z-side may be referred to as downward, lower side, or down.

Figure 2:
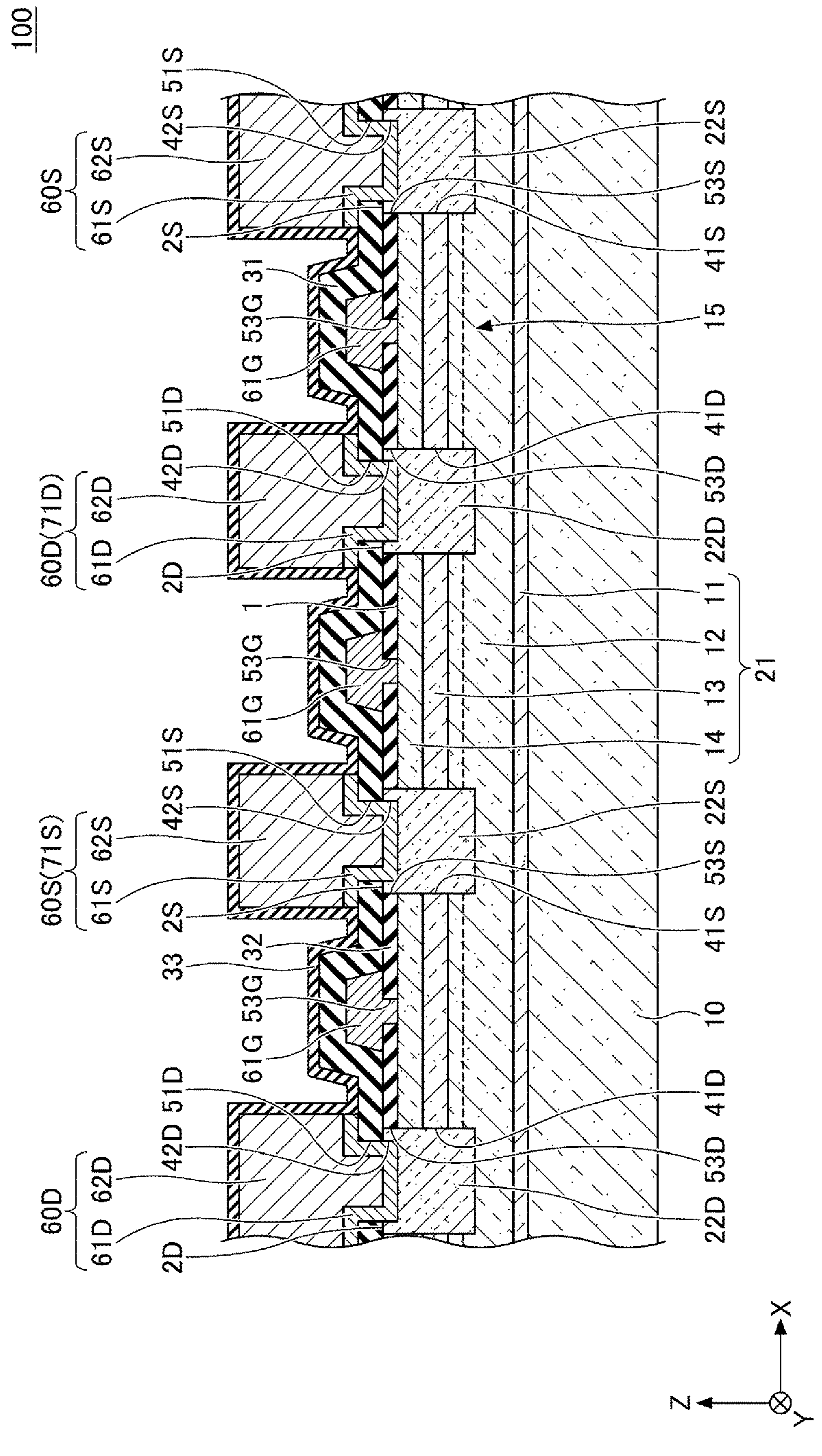
FIG. 2 is a cross sectional view (part 1) illustrating the semiconductor device according to the embodiment.
Figure 3:
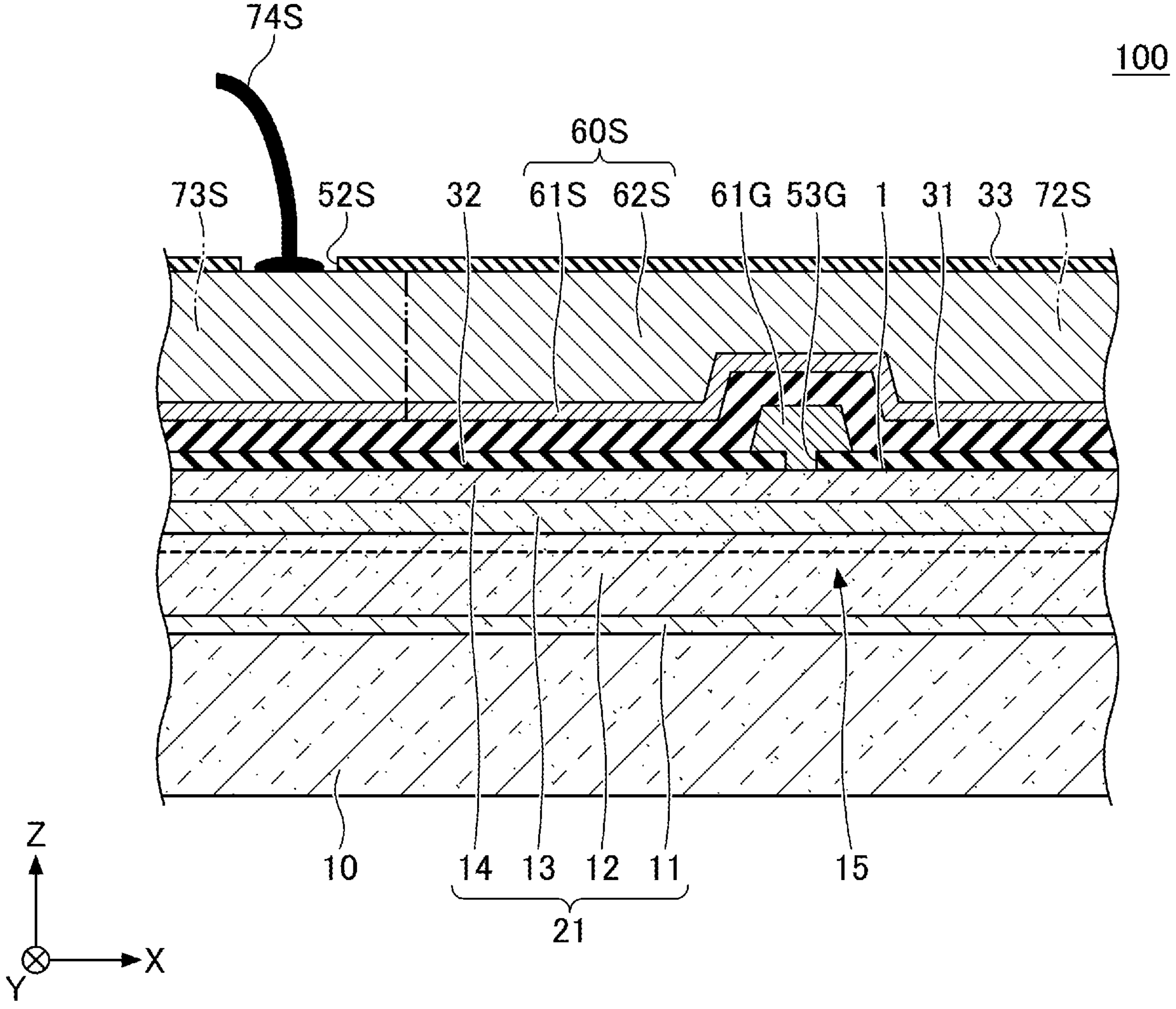
FIG. 3 is a cross sectional view (part 2) illustrating the semiconductor device according to the embodiment.
Figure 4:
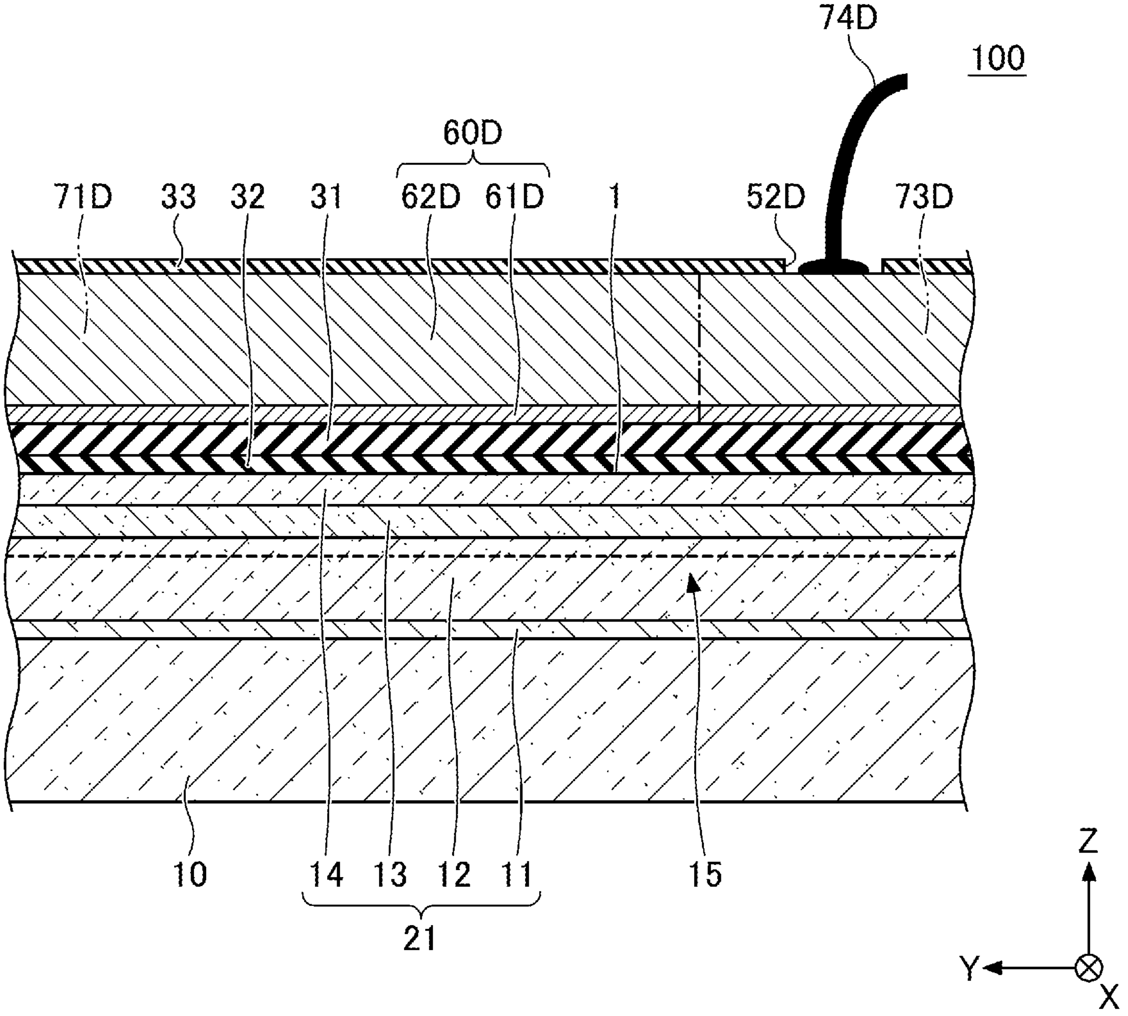
FIG. 4 is a cross sectional view (part 3) illustrating the semiconductor device according to the embodiment.

Embodiments relate to a semiconductor device having a GaN-based high electron mobility transistor (HEMT). FIG. 1 is a diagram illustrating a layout of electrodes and pads of a semiconductor device according to one embodiment. FIG. 2 through FIG. 4 are cross sectional views illustrating the semiconductor device according to the embodiment. FIG. 2 corresponds to a cross sectional view taken along a line II-II in FIG. 1. FIG. 3 corresponds to a cross sectional view taken along a line III-III in FIG. 1. FIG. 4 corresponds to a cross sectional view taken along a line IV-IV in FIG. 1.

As illustrated in FIG. 1 through FIG. 4, a semiconductor device 100 according to the embodiment includes a substrate 10, and a laminated structure 21. The substrate 10 is a silicon carbide (SiC) substrate having a (0001) plane, for example, and a laminating direction of the laminated structure 21 is a [0001] direction, for example. The laminated structure 21 is provided on the substrate 10. The laminated structure 21 includes a nucleation layer 11, a channel layer 12, a barrier layer 13, and a cap layer 14. The laminated structure 21 is an example of a first nitride semiconductor layer.

The nucleation layer 11 is formed on the substrate 10. For example, the nucleation layer 11 is an aluminum nitride (AlN) layer, and the nucleation layer 11 has a thickness in a range greater than or equal to 5 nm and less than or equal to 20 nm. The nucleation layer 11 functions as a seed layer with respect to the channel layer 12.

The channel layer 12 is epitaxially grown and formed on the nucleation layer 11. For example, the channel layer 12 is an undoped gallium nitride (GaN) layer, and the channel layer 12 has a thickness of 500 nm. The channel layer 12 functions as an electron transit layer.

The barrier layer 13 is epitaxially grown and formed on the channel layer 12. For example, the barrier layer 13 is an aluminum gallium nitride (AlGaN) layer, an indium aluminum nitride (InAlN) layer, or an indium aluminum gallium nitride (InAlGaN) layer. The barrier layer 13 has a thickness in a range greater than or equal to 5 nm and less than or equal to 30 nm, for example. A band gap of the barrier layer 13 is larger than a band gap of the channel layer 12. In a case where the barrier layer 13 is the AlGaN layer, an Al composition of the barrier layer 13 is in a range greater than or equal to 0.15 and less than or equal to 0.35, for example. A conductivity type of the barrier layer 13 is n-type or undoped. The barrier layer 13 and the channel layer 12 may make contact with each other, and a spacer layer (not illustrated) may be interposed between the barrier layer 13 and the channel layer 12. Strain is generated between the barrier layer 13 and the channel layer 12 due to a difference between lattice constants thereof. For this reason, a two-dimensional electron gas (2DEG) 15, caused by piezoelectric charge, is generated in a region of the channel layer 12 in a vicinity of an interface between the barrier layer 13 and the channel layer 12, to thereby form a channel region. The barrier layer 13 functions as an electron supply layer.

The cap layer 14 is epitaxially grown and formed on the barrier layer 13. For example, the cap layer 14 is a GaN layer, and the cap layer 14 has a thickness of 5 nm. For example, a conductivity type of the cap layer 14 is n-type.

The laminated structure 21 has a first surface 1. The first surface 1 is an upper surface of the laminated structure 21. The cap layer 14 forms the first surface 1. A plurality of recesses 41S and a plurality of recesses 41D are formed in the first surface 1. The recesses 41S and 41D extend in a direction parallel to a Y-axis direction, and are alternately provided along an X-axis direction. The recesses 41S and 41D penetrate the cap layer 14 and the barrier layer 13, and reach the channel layer 12. Bottom surfaces of the recesses 41S and 41D are located in the channel layer 12. The bottom surfaces of the recesses 41S and 41D are located at positions deeper than the 2DEG 15. The recesses 41S and 41D are examples of a first recess.

The semiconductor device 100 has an insulating film 32. The insulating film 32 covers the laminated structure 21. For example, the insulating film 32 is a nitride film, such as a silicon nitride (SiN) film or the like, and the insulating film 32 has a thickness in a range greater than or equal to 10 nm and less than or equal to 100 nm. A plurality of openings 53S, a plurality of openings 53D, and a plurality of openings 53G are formed in the insulating film 32. The openings 53S, 53D, and 53G extend in a direction parallel to the Y-axis direction. The opening 53S is continuous with the recess 41S, and the opening 53D is continuous with the recess 41D. The opening 53G is provided between the opening 53S and the opening 53D that are adjacent to each other in the X-axis direction. The insulating film 32 is an example of a second insulating film. The openings 53S and 53D are examples of a third opening.

The semiconductor device 100 has semiconductor layers 22S and 22D. The semiconductor layer 22S is provided inside the recess 41S, and the semiconductor layer 22D is provided inside the recess 41D. A portion of the semiconductor layer 22S may be located on an inner side of the opening 53S, and a portion of the semiconductor layer 22D may be located on an inner side of the opening 53D. For example, the semiconductor layers 22S and 22D are GaN layers, and a conductivity type of the semiconductor layers 22S and 22D is n-type. The semiconductor layers 22S and 22D include the n-type impurity with a concentration higher than a concentration of the n-type impurity of the barrier layer 13. A carrier concentration in the semiconductor layers 22S and 22D is higher than a carrier concentration in the laminated structure 21. The carrier concentration in the semiconductor layers 22S and 22D is greater than or equal to $2\times10^{20}$ $cm^{-3}$, and a carrier mobility of the semiconductor layers 22S and 22D is greater than or equal to 20 $cm^2/Vs$. The semiconductor layers 22S and 22D are examples of a second nitride semiconductor layer.

The semiconductor layer 22S has a second surface 2S. The second surface 2S is an upper surface of the semiconductor layer 22S. Recesses 42S are formed in the second surface 2S. In a plan view perpendicular to the first surface 1, the recesses 42S are preferably formed on an inner side of the openings 53S, respectively, but the recesses 42S may have the same shape as the openings 53S. For example, a length of the recess 42S in a direction parallel to the first surface 1 may be the same as a length of the opening 53S in the direction parallel to the first surface 1. Thus, a local interconnect region 71S which will be described later, formed inside the recess 42S, makes direct contact with the semiconductor layer 22S for the length of the recess 42S. The recess 42S has a depth in a range greater than or equal to 5 nm and less than or equal to 50 nm, for example. The semiconductor layer 22D has a second surface 2D. The second surface 2D is an upper surface of the semiconductor layer 22D. The recess 42D is formed in the second surface 2D. In the plan view perpendicular to the first surface 1, the recess 42D is preferably formed on an inner side of the opening 53D, but the recess 42D may have the same shape as the opening 53D. For example, a length of the recess 42D in the direction parallel to the first surface 1 may be the same as a length of the opening 53D in the direction parallel to the first surface 1. Thus, a local interconnect region 71D which will be described later, formed inside the recess 42D, makes direct contact with the semiconductor layer 22D for the length of the recess 42D. The recess 42D has a depth in a range greater than or equal to 5 nm and less than or equal to 50 nm, for example. The recesses 42S and 42D are examples of a second recess.

The semiconductor device 100 has gate electrodes 61G. The gate electrodes 61G cover the openings 53G of the insulating film 32, and make Schottky contact with the cap layer 14 through the openings 53G. Each of the gate electrodes 61G include a nickel (Ni) layer, a palladium (Pd) layer, and a gold (Au) layer successively laminated in this order in an upward direction, for example.

The semiconductor device 100 has an insulating film 31. The insulating film 31 covers the gate electrodes 61G, the insulating film 32, the semiconductor layer 22S, and the semiconductor layer 22D. The insulating film 31 covers the laminated structure 21 from above the gate electrodes 61G and the insulating film 32. For example, the insulating film 31 is a nitride film, such as a SiN film or the like, and the insulating film 31 has a thickness in a range greater than or equal to 10 nm and less than or equal to 50 nm. A plurality of openings 51S and a plurality of openings 51D are formed in the insulating film 31. The openings 51S and 51D extend in the direction parallel to the Y-axis direction. The openings 51S reach the semiconductor layer 22S, and the openings 51D reach the semiconductor layer 22D. In the plan view perpendicular to the first surface 1, the opening 51S is located on an inner side of the opening 53S, and the opening 51D is located on an inner side of the opening 53D. The recess 42S is continuous with the opening 51S, and the recess 42D is continuous with the opening 51D. At least a portion of the semiconductor layer 22S is exposed from the opening 51S, and at least a portion of the semiconductor layer 22D is exposed from the opening 51D. The opening 51S may expose the entire second surface 2S of the semiconductor layer 22S from the insulating film 31, and the opening 51D may expose the entire second surface 2D of the semiconductor layer 22D from the insulating film 31. The insulating film 31 is an example of a first insulating film. The openings 51S and 51D are examples of a first opening.

The semiconductor device 100 includes an interconnect layer 60S, an interconnect layer 60D, and an interconnect layer 60G.

As illustrated in FIG. 1, the interconnect layer 60S has a plurality of local interconnect regions 71S, a global interconnect region 72S, and a pad region 73S. The local interconnect regions 71S extend in the direction parallel to the Y-axis direction. The local interconnect regions 71S make ohmic contact with the semiconductor layer 22S through the openings 51S. The global interconnect region 72S extends in the X-axis direction. The global interconnect region 72S is connected to an end on the +Y-side of the local interconnect regions 71S. The pad region 73S extends in the Y-axis direction. The pad region 73S is connected to the an end on the −X-side of the global interconnect region 72S.

The interconnect layer 60S includes a seed layer 61S and a plating layer 62S in each of the plurality of local interconnect regions 71S, the global interconnect region 72S, and the pad region 73S. For example, the seed layer 61S includes a titanium (Ti) layer, and the seed layer 61S has a thickness in a range greater than or equal to 50 nm and less than or equal to 300 nm. For example, the plating layer 62S includes a gold (Au) layer, and the plating layer 62S has a thickness in a range greater than or equal to 1000 nm and less than or equal to 9000 nm. The plating layer 62S has an electrical resistance lower than an electrical resistance of the seed layer 61S. The second surface 2S of the semiconductor layer 22S opposes the local interconnect regions 71S. The local interconnect regions 71S make direct contact with the semiconductor layer 22S at an inner surface of the recesses 42S, that is, at a side surface and a bottom surface of the recesses 42S. However, as described above, in the case where the length of the recess 42S in the direction parallel to the first surface 1 is the same as the length of the opening 53S in the direction parallel to the first surface 1, the local interconnect regions 71S make direct contact with the semiconductor layer 22S only at the bottom surface of the recesses 42S. The seed layer 61S makes direct contact with the inner surface of the recesses 42S, an inner surface of the openings 51S, and an upper surface of the insulating film 31. The plating layer 62S is provided on the seed layer 61S. The seed layer 61S is an example of a first metal layer, and the plating layer 62S is an example of a second metal layer. The kind of the metal layer included in the local interconnect regions 71S, the kind of the metal layer included in the global interconnect region 72S, and the kind of the metal layer included in the pad region 73S, may be the same.

As illustrated in FIG. 1, the interconnect layer 60D has a plurality of local interconnect regions 71D, and a pad region 73D. The local interconnect regions 71D extend in the direction parallel to the Y-axis direction. The local interconnect regions 71D make ohmic contact with the semiconductor layer 22D through the openings 51D. The pad region 73D extends in the X-axis direction. The pad region 73D is connected to an end on the −Y-side of the local interconnect regions 71D.

The interconnect layer 60D includes a seed layer 61D and a plating layer 62D in each of the plurality of local interconnect regions 71D and the pad region 73D. For example, the seed layer 61D includes a Ti layer, and the seed layer 61D has a thickness in a range greater than or equal to 50 nm and less than or equal to 300 nm. For example, the plating layer 62D includes a Au layer, and the plating layer 62D has a thickness in a range greater than or equal to 1000 nm and less than or equal to 9000 nm. The plating layer 62D has an electrical resistance lower than an electrical resistance of the seed layer 61D. The second surface 2D of the semiconductor layer 22D opposes the local interconnect regions 71D. The local interconnect regions 71D make direct contact with the inner surface of the recesses 42D, that is, the side surface and the bottom surface of the recesses 42D. However, as described above, in the case where the length of the recess 42D in the direction parallel to the first surface 1 is the same as the length of the opening 53D in the direction parallel to the first surface 1, the local interconnect regions 71D make direct contact with the semiconductor layer 22D only at the bottom surface of the recesses 42D. The seed layer 61D makes direct contact with the inner surface of the recesses 42D, an inner surface of the openings 51D, and the upper surface of the insulating film 31. The plating layer 62D is provided on the seed layer 61D. The seed layer 61D is an example of a first metal layer, and the plating layer 62D is an example of a second metal layer. The kind of the metal layer included in the local interconnect regions 71D and the kind of the metal layer included in the pad region 73D may be the same.

As illustrated in FIG. 1, the interconnect layer 60G extends in the X-axis direction. The interconnect layer 60G is located on the +Y-side of the global interconnect region 72S of the interconnect layer 60S. The interconnect layer 60G includes a seed layer and a plating layer (not illustrated), similar to the interconnect layers 60S and 60D. Openings (not illustrated) are formed in the insulating film 31 above the ends on the +Y-side of the gate electrodes 61G, and the interconnect layer 60G makes direct contact with the gate electrodes 61G through the openings.

The semiconductor device 100 has a passivation film 33. The passivation film 33 covers the interconnect layers 60S, 60D, and 60G, and the insulating film 31. As illustrated in FIG. 3, an opening 52S that exposes a portion of the pad region 73S of the interconnect layer 60S is formed in the passivation film 33. A bonding wire 74S is connected to the portion of the pad region 73S exposed from the opening 52S. As illustrated in FIG. 4, an opening 52D that exposes a portion of the pad region 73D of the interconnect layer 60D is formed in the passivation film 33. A bonding wire 74D is connected to the portion of the pad region 73D exposed from the opening 52D. An opening (not illustrated) that exposes a portion of the interconnect layer 60G is formed in the passivation film 33. A bonding wire (not illustrated) is connected to the portion of the interconnect layer 60G exposed from the opening. The interconnect layer 60G may function as a pad region. The openings 52S and 52D are examples of a second opening.

The interconnect layer 60S includes a seed layer 61S and a plating layer 62S in a region overlapping the opening 52S in the plan view perpendicular to the first surface 1. The interconnect layer 60S also includes the seed layer 61S and the plating layer 62S in a region overlapping the recess 42S in the plan view perpendicular to the first surface 1. The interconnect layer 60D includes a seed layer 61D and a plating layer 62D in a region overlapping the opening 52D in the plan view perpendicular to the first surface 1. The interconnect layer 60D also includes the seed layer 61D and the plating layer 62D in a region overlapping the recess 42D in the plan view perpendicular to the first surface 1.

Next, a method for manufacturing the semiconductor device 100 according to the embodiment will be described. FIG. 5 through FIG. 13 are cross sectional views illustrating the method for manufacturing the semiconductor device according to the embodiment. FIG. 5 through FIG. 13 illustrate changes in the cross section illustrated in FIG. 2.

Figure 5:
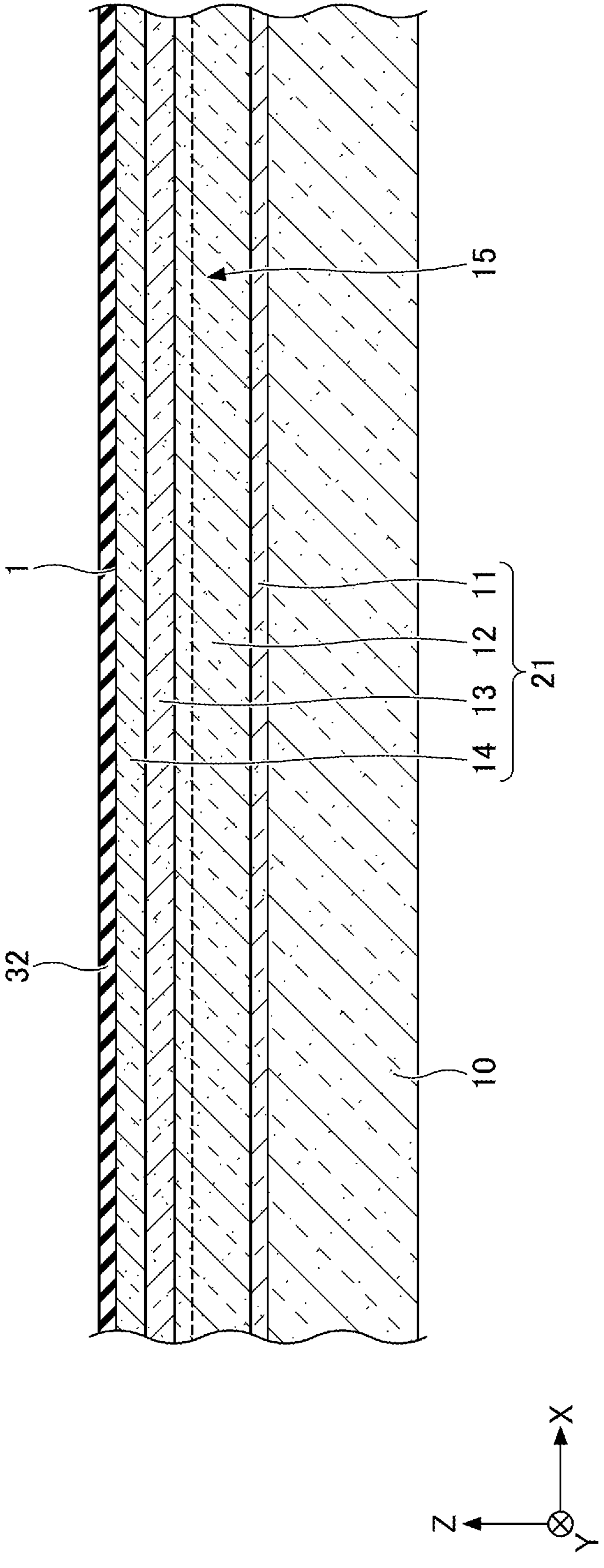
FIG. 5 is a cross sectional view (part 1) illustrating a method for manufacturing the semiconductor device according to the embodiment.

First, as illustrated in FIG. 5, the laminated structure 21 including a plurality of nitride semiconductor layers is formed on the substrate 10 by metal organic chemical vapor deposition (MOCVD). More particularly, first, the nucleation layer 11 is grown on the substrate 10. In a case where the nucleation layer 11 is an AlN layer, a source gas is trimethylaluminum (TMA) and ammonia ($NH_3$), for example. Next, the channel layer 12 is grown on the nucleation layer 11. In a case where the channel layer 12 is a GaN layer, a source gas is trimethylgallium (TMG) and $NH_3$, for example. Then, the barrier layer 13 is grown on the channel layer 12. In a case where the barrier layer 13 is an AlGaN layer, a source gas is TMA, TMG, and $NH_3$, for example. Next, the cap layer 14 is grown on the barrier layer 13. In a case where the cap layer 14 is a GaN layer, a source gas is TMG and $NH_3$, for example.

Next, the insulating film 32, making contact with the first surface 1 of the laminated structure 21, is formed. The insulating film 32 is formed by low-pressure chemical vapor deposition (CVD) or plasma CVD, for example.

Figure 6:
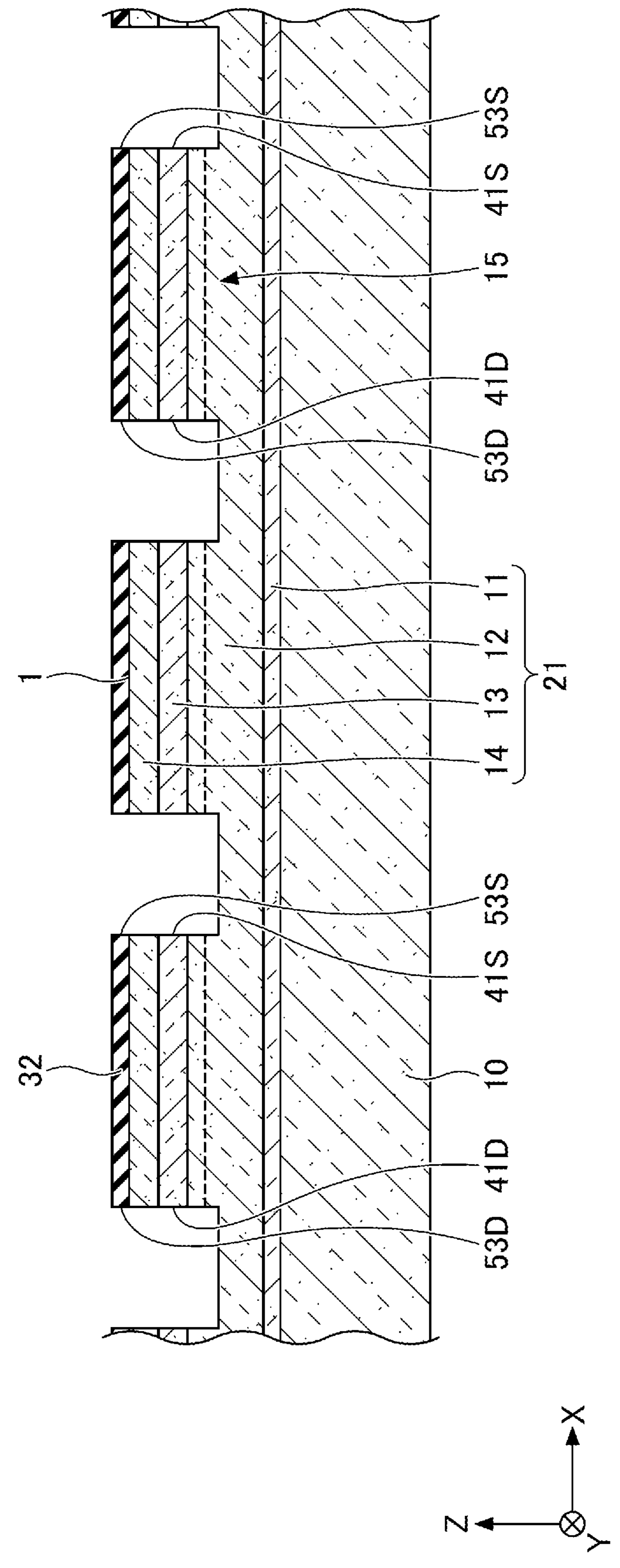
FIG. 6 is a cross sectional view (part 2) illustrating the method for manufacturing the semiconductor device according to the embodiment.

Next, as illustrated in FIG. 6, the openings 53S and 53D are formed in the insulating film 32, and the recesses 41S and 41D are formed in the laminated structure 21. The openings 53S and 53D are formed by reactive ion etching (RIE) of the insulating film 32, using a resist pattern as a mask, for example. When the insulating film 32 is subjected to the RIE, a reactive gas including fluorine (F) is used, for example. The recesses 41S and 41D are formed by RIE of the laminated structure 21, using the resist pattern used to form the openings 53S and 53D as the mask. When the laminated structure 21 is subjected to the RIE, a reactive gas including chlorine (Cl) is used, for example.

Figure 7:
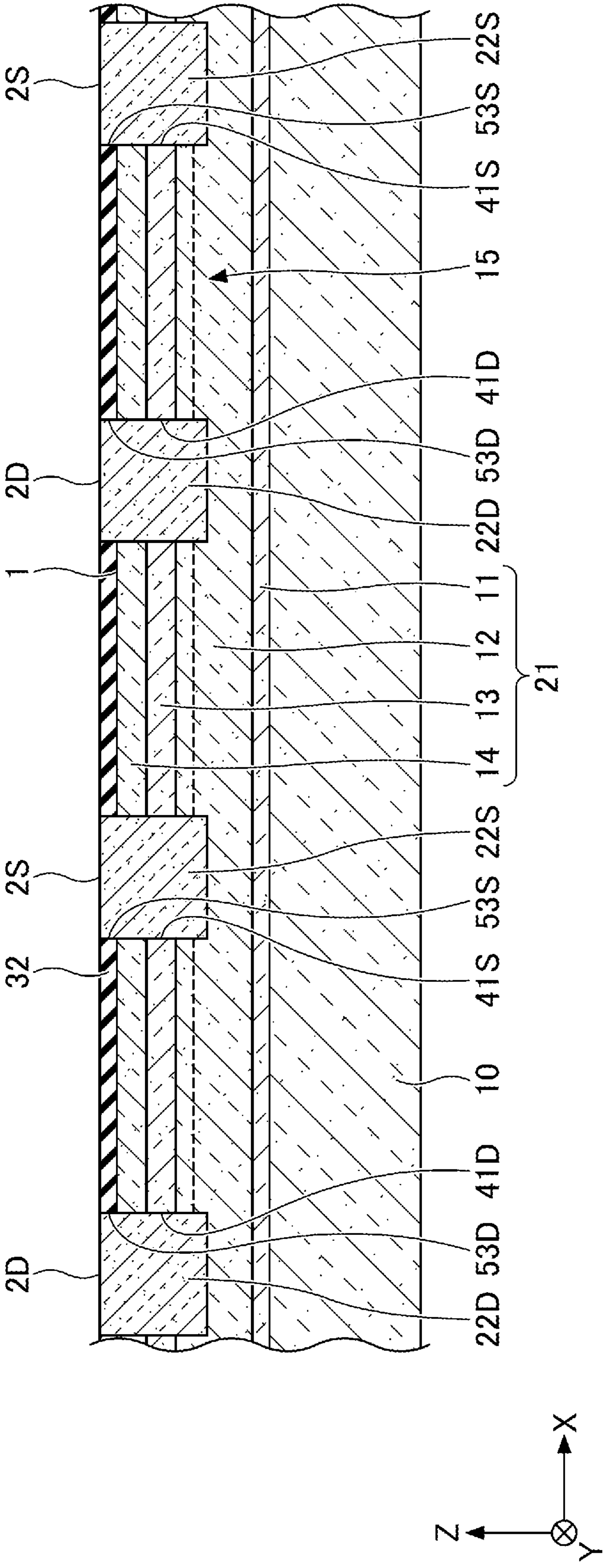
FIG. 7 is a cross sectional view (part 3) illustrating the method for manufacturing the semiconductor device according to the embodiment.

Next, as illustrated in FIG. 7, the semiconductor layer 22S is formed inside the recess 41S, and the semiconductor layer 22D is formed inside the recess 41D. The semiconductor layers 22S and 22D are formed by growing crystals of the semiconductor layers by MOCVD, molecular beam epitaxy (MBE), or sputtering, using a mask, and thereafter removing the mask.

Figure 8:
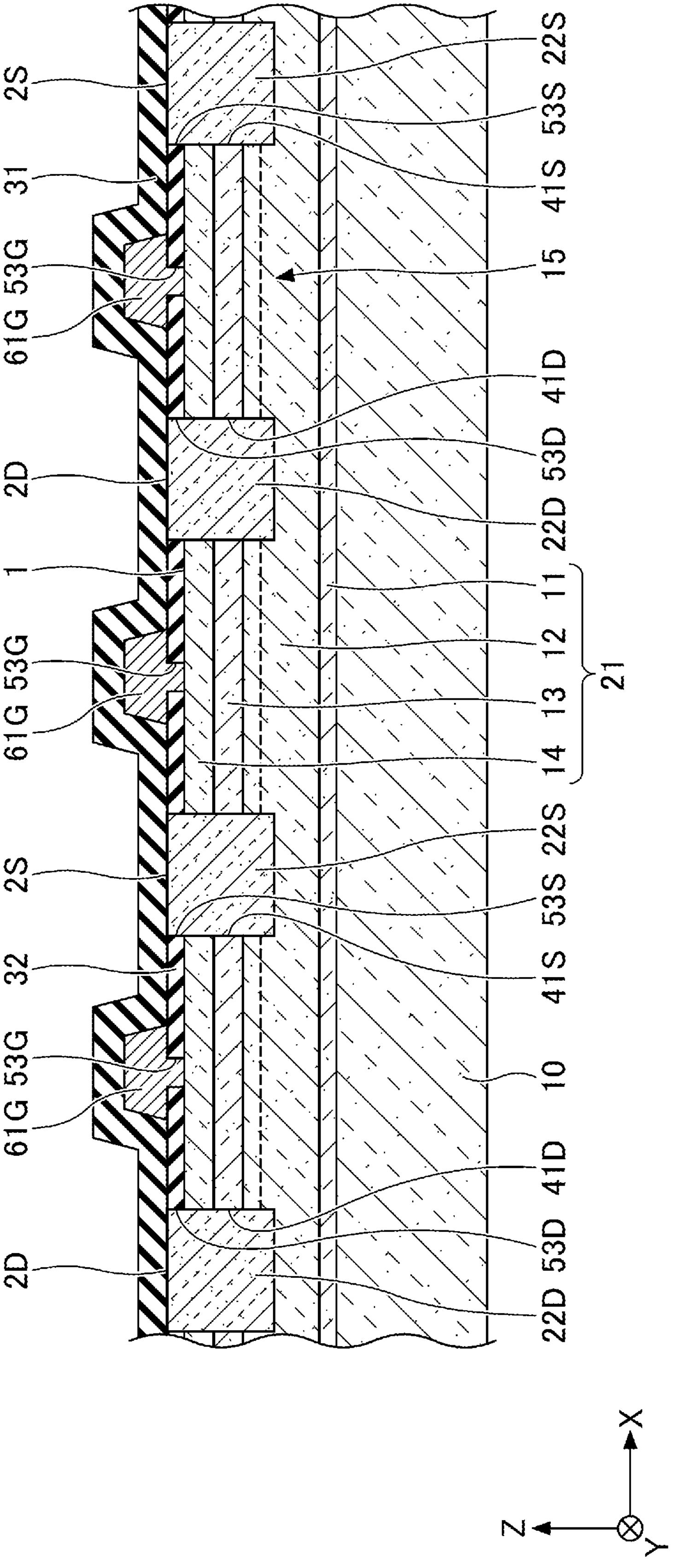
FIG. 8 is a cross sectional view (part 4) illustrating the method for manufacturing the semiconductor device according to the embodiment.

Next, as illustrated in FIG. 8, the openings 53G are formed in the insulating film 32. The openings 53G are formed by RIE using a resist pattern as a mask, for example. A reactive gas including F is used to etch the insulating film 32, for example. Next, the gate electrodes 61G are formed on the insulating film 32. The gate electrodes 61G can be formed by vapor deposition and lift-off, for example. The gate electrodes 61G make Schottky contact with the cap layer 14 through the openings 53G. Next, the insulating film 31 is formed to cover the gate electrodes 61G, the insulating film 32, the semiconductor layer 22S, and the semiconductor layer 22D. The insulating film 31 can be formed by plasma CVD, for example.

Figure 9:
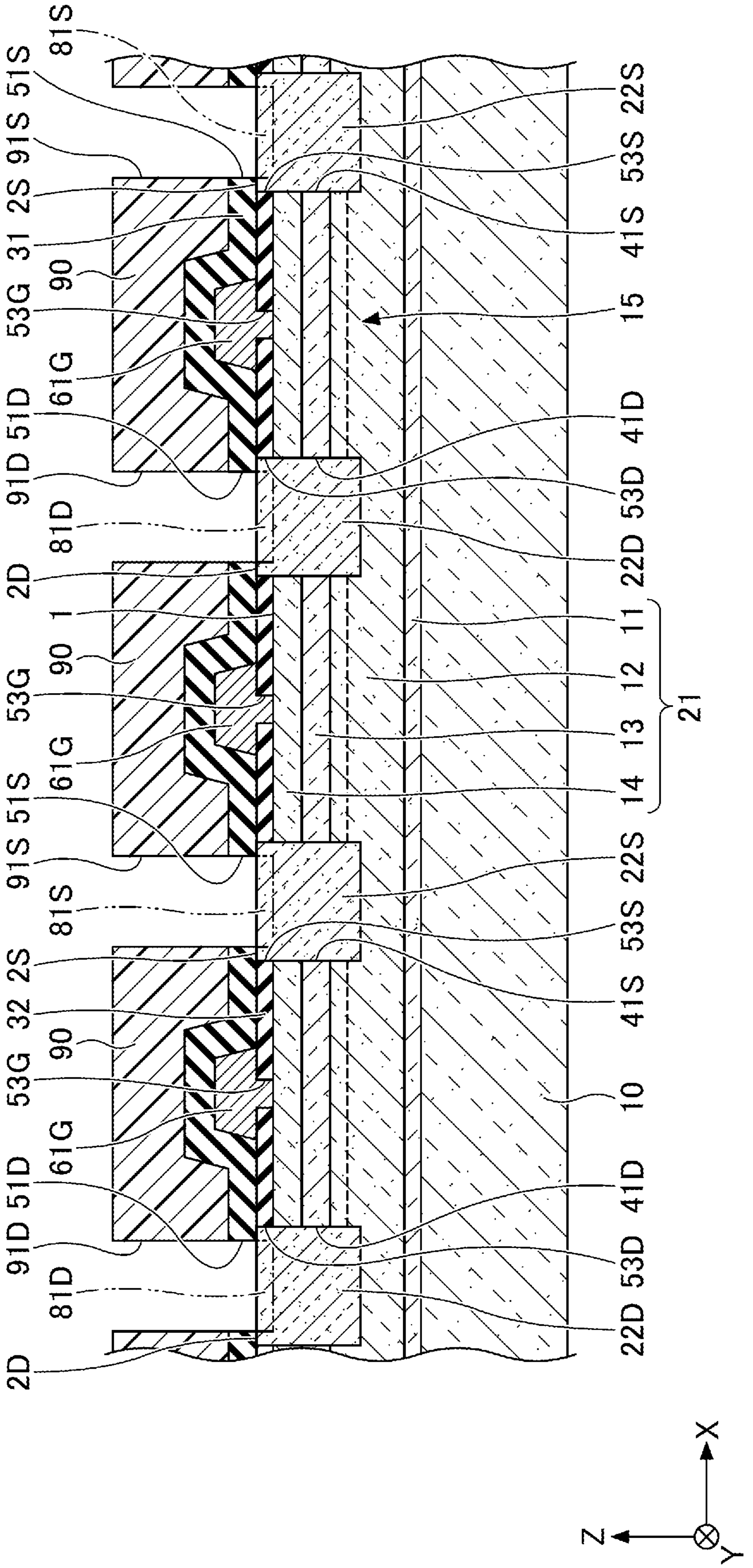
FIG. 9 is a cross sectional view (part 5) illustrating the method for manufacturing the semiconductor device according to the embodiment.

Next, as illustrated in FIG. 9, a resist pattern 90 is formed on the insulating film 31. Openings 91S and openings 91D are formed in the resist pattern 90. Regions of the insulating film 31 where the openings 51S are to be formed are exposed from the openings 91S, and regions of the insulating film 31 where the openings 51D are to be formed are exposed from the openings 91D. Next, the insulating film 31 is subjected to RIE, using the resist pattern 90 as a mask. When subjecting the insulating film 31 to the RIE, a reactive gas including F, such as tetrafluoromethane ($CF_4$), sulfurhexafluoride ($SF_6$), or the like, for example, is used. During this RIE, a damaged layer 81S including damage caused by the RIE is inevitably formed in a portion of the semiconductor layer 22S exposed from the opening 51S, and a damaged layer 81D including damage caused by the RIE is inevitably formed in a portion of the semiconductor layer 22D exposed from the opening 51D.

Figure 10:
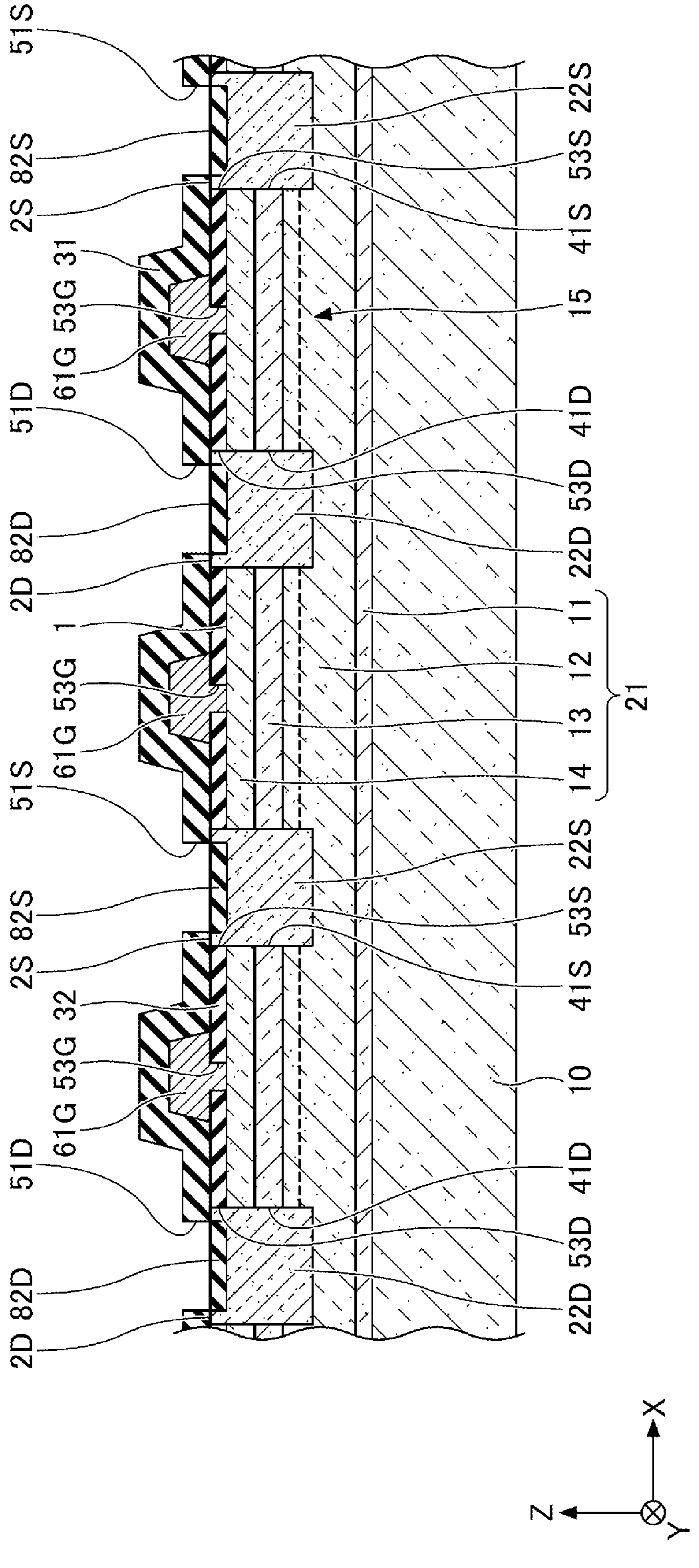
FIG. 10 is a cross sectional view (part 6) illustrating the method for manufacturing the semiconductor device according to the embodiment.

Next, as illustrated in FIG. 10, the resist pattern 90 is removed. Further, the portion of the semiconductor layer 22S including the damaged layer 81S is oxidized to form an oxide layer 82S, and the portion of the semiconductor layer 22D including the damaged layer 81D is oxidized to form an oxide layer 82D. When forming the oxide layers 82S and 82D, strong ashing is performed using oxygen plasma with an output of approximately 1000 W, for example. Because the crystal structure is disordered in the damaged layers 81S and 81D, the damaged layers 81S and 81D are more easily oxidized than the remaining portions of the semiconductor layers 22S and 22D. The resist pattern 90 may be performed after forming the oxide layers 82S and 82D.

Figure 11:
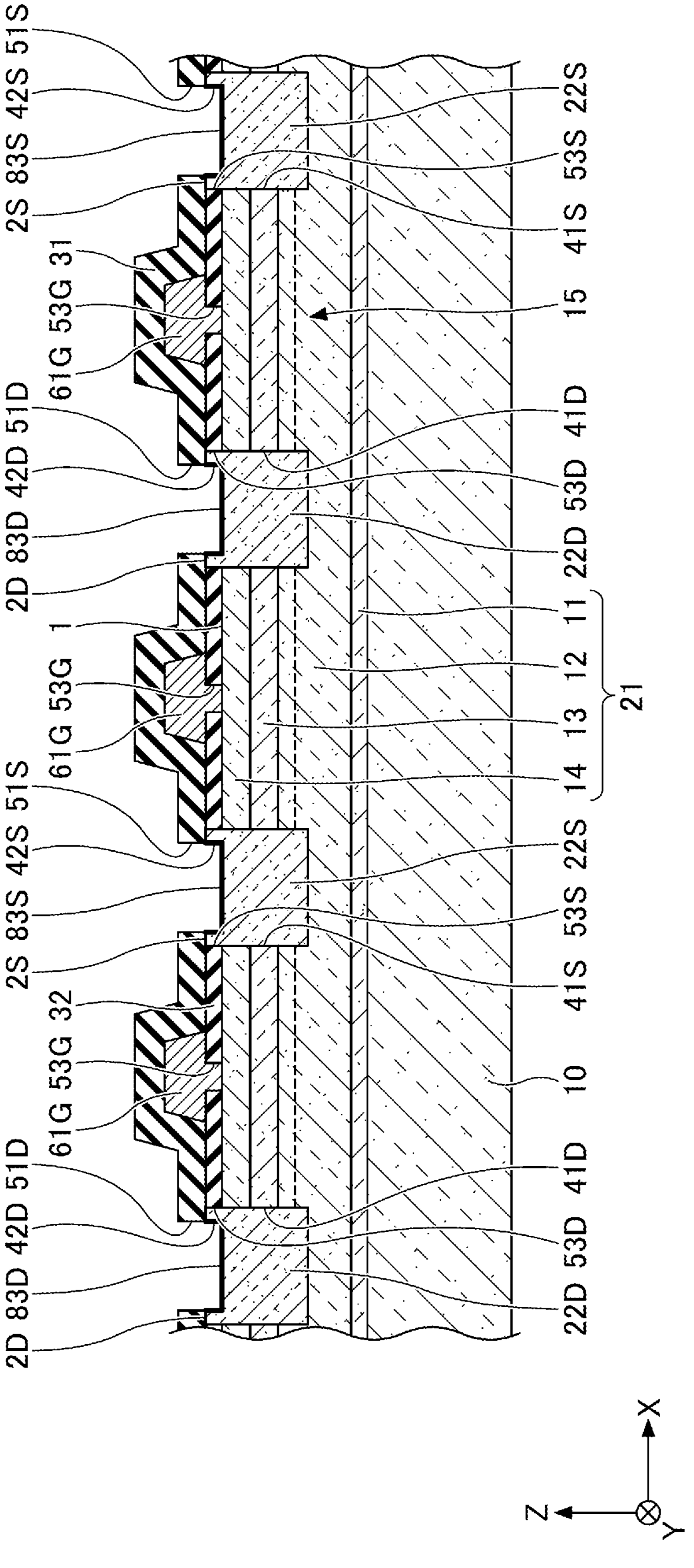
FIG. 11 is a cross sectional view (part 7) illustrating the method for manufacturing the semiconductor device according to the embodiment.

Next, as illustrated in FIG. 11, the oxide layers 82S and 82D are removed. The oxide layers 82S and 82D can be removed by wet etching, using an alkaline etchant, for example. A wet etching time is in a range of 1 minute to 5 minutes, for example. Examples of solutions usable as the alkaline etchant include solutions including potassium hydrate (KOH) or ammonium hydroxide (aqueous ammonia, $NH_4OH$), for example. The oxide layers 82S and 82D may be removed by wet etching, using an acidic etchant. When the semiconductor layers 22S and 22D are exposed to the atmosphere after the removing the oxide layers 82S and 82D, a natural oxide film 83S is formed on the surface of the semiconductor layer 22S, and a natural oxide film 83D is formed on the surface of the semiconductor layer 22D. The natural oxide films 83S and 83D have a thickness in a range of approximately 1 nm to approximately several nm. The natural oxide films 83S and 83D include gallium oxide, for example.

Figure 12:
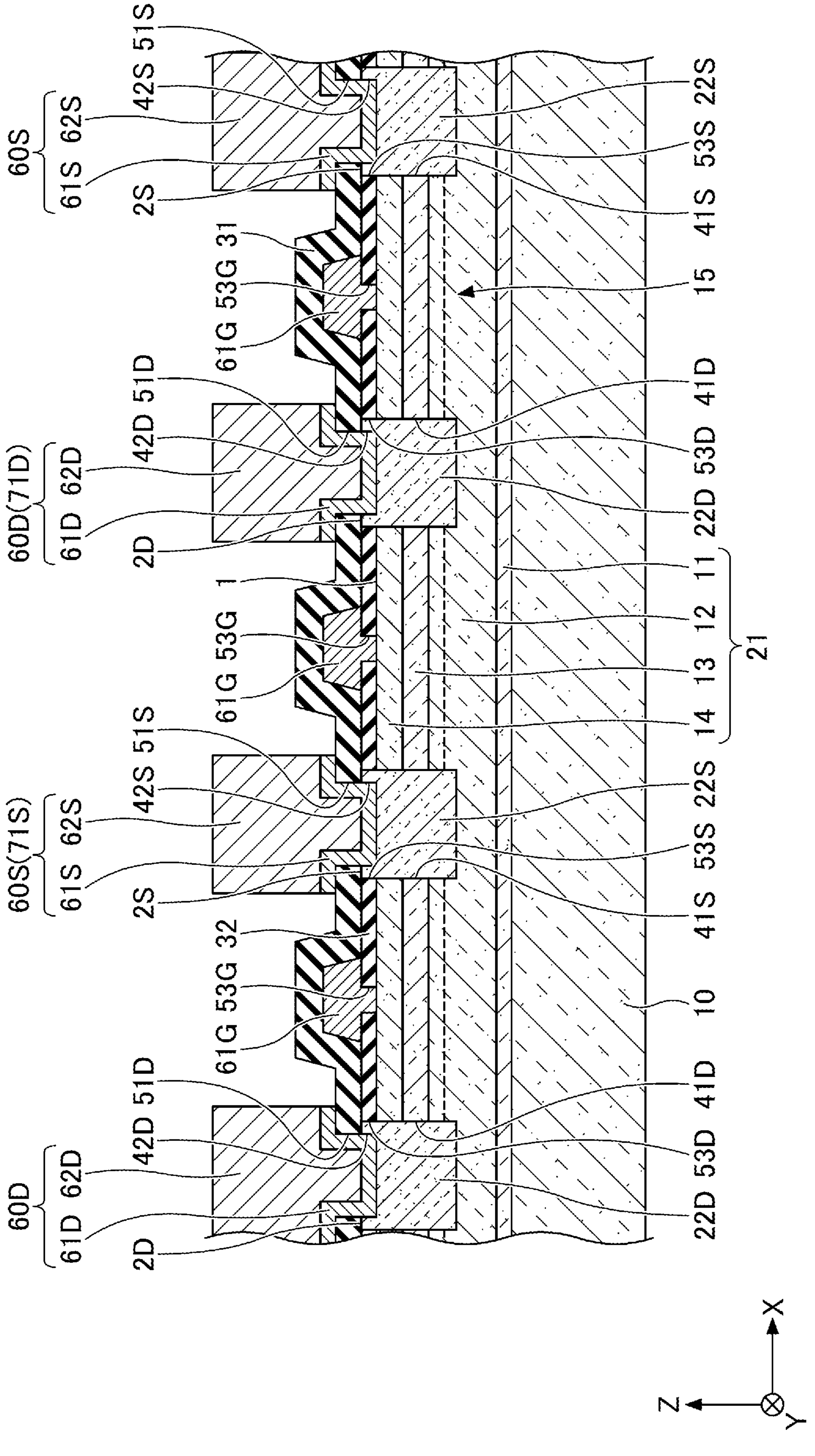
FIG. 12 is a cross sectional view (part 8) illustrating the method for manufacturing the semiconductor device according to the embodiment.

Next, as illustrated in FIG. 12, the natural oxide films 83S and 83D are removed, and the interconnect layers 60S and 60D are formed. When removing the natural oxide films 83S and 83D, milling, such as argon (Ar) milling or the like, or wet etching using an acidic solution, such as diluted hydrochloric acid or the like, for example, is performed. Both the milling and the wet etching may be performed. The interconnect layers 60S and 60D can be formed by a semi-additive method as will be described below, for example. That is, a seed layer is formed to cover the surfaces of the semiconductor layer 22S, the semiconductor layer 22D, and the insulating film 31, a resist mask having openings in regions where the plating layers 62S and 62D are to be formed is formed, and a plating layer is formed. The seed layer can be formed by vapor deposition or sputtering, for example. The plating layer can be formed by electrolytic plating, for example. After forming the plating layer, the resist mask is removed, and the seed layer covered with the resist mask is removed. Accordingly, the interconnect layer 60S including the seed layer 61S and the plating layer 62S, and the interconnect layer 60D including the seed layer 61D and the plating layer 62D, are formed.

Openings that expose the gate electrodes 61G may be formed in the insulating film 31 simultaneously as the openings 51S and 51D, and the interconnect layer 60G (refer to FIG. 1) that makes contact with the gate electrodes 61G may be formed simultaneously as the interconnect layers 60S and 60D.

Figure 13:
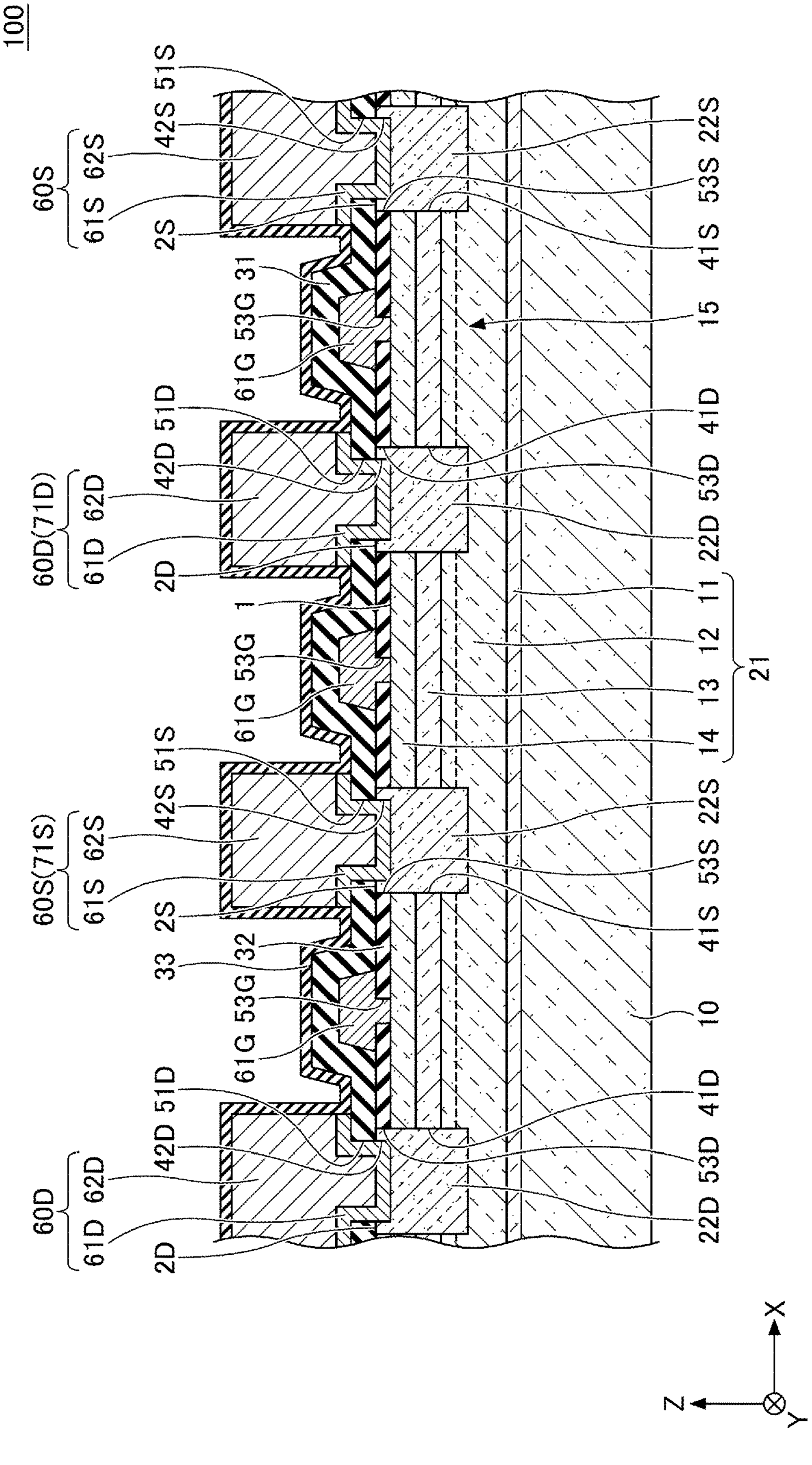
FIG. 13 is a cross sectional view (part 9) illustrating the method for manufacturing the semiconductor device according to the embodiment.

Next, as illustrated in FIG. 13, the passivation film 33 is formed to cover the interconnect layers 60S, 60D, and 60G, and the insulating film 31. The passivation film 33 can be formed by plasma CVD, for example. Next, the openings 52S (refer to FIG. 3) that expose portions of the pad region 73S of the interconnect layer 60S, the openings 52D (refer to FIG. 4) that expose portions of the pad region 73D of the interconnect layer 60D, and the openings (not illustrated) that expose portions of the interconnect layer 60G, are formed in the passivation film 33.

The semiconductor device 100 according to the embodiment can be manufactured in the manner described above.

In the semiconductor device 100, the damaged layer 81S is locally formed in the semiconductor layer 22S when forming the openings 51S in the insulating film 31, but the damaged layer 81S is removed and the recesses 41S are formed in the semiconductor layer 22S. For this reason, an excellent ohmic contact can be obtained between the interconnect layer 60S and the semiconductor layer 22S. Further, the damaged layer 81D is locally formed in the semiconductor layer 22D when forming the openings 51D in the insulating film 31, but the damaged layer 81D is removed and the recesses 41D are formed in the semiconductor layer 22D. Hence, an excellent ohmic contact can be obtained between the interconnect layer 60D and the semiconductor layer 22D.

Further, because the excellent ohmic contacts can obtained between the interconnect layer 60S and the semiconductor layer 22D, and between and interconnect layer 60D and the semiconductor layer 22D, it is possible to reduce a margin between the semiconductor layers 22S and 22D and the interconnect layers 60S and 60D, when compared to a reference example described below.

Figure 14:
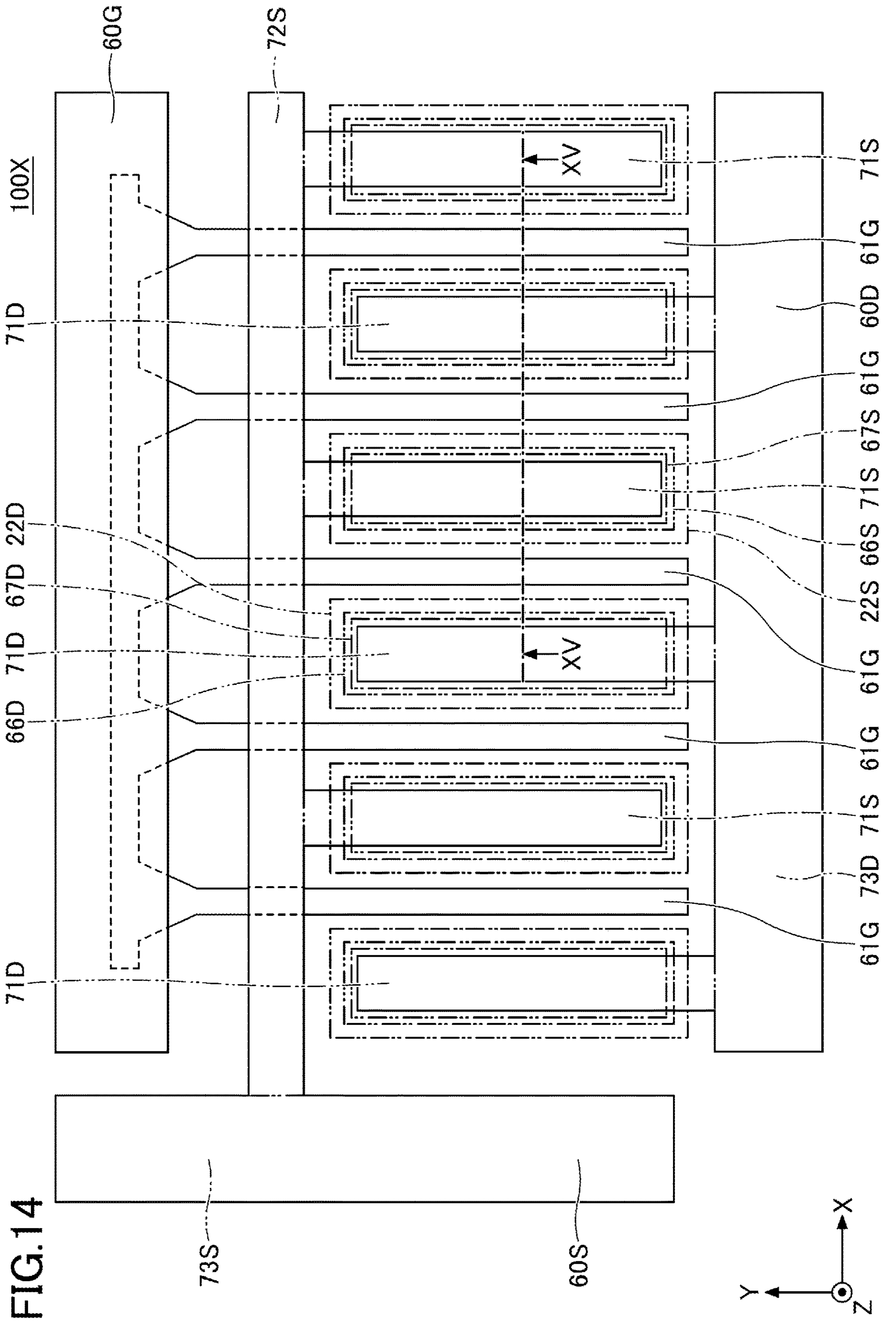
FIG. 14 is a diagram illustrating a layout of electrodes and pads of a semiconductor device according to a reference example.
Figure 15:
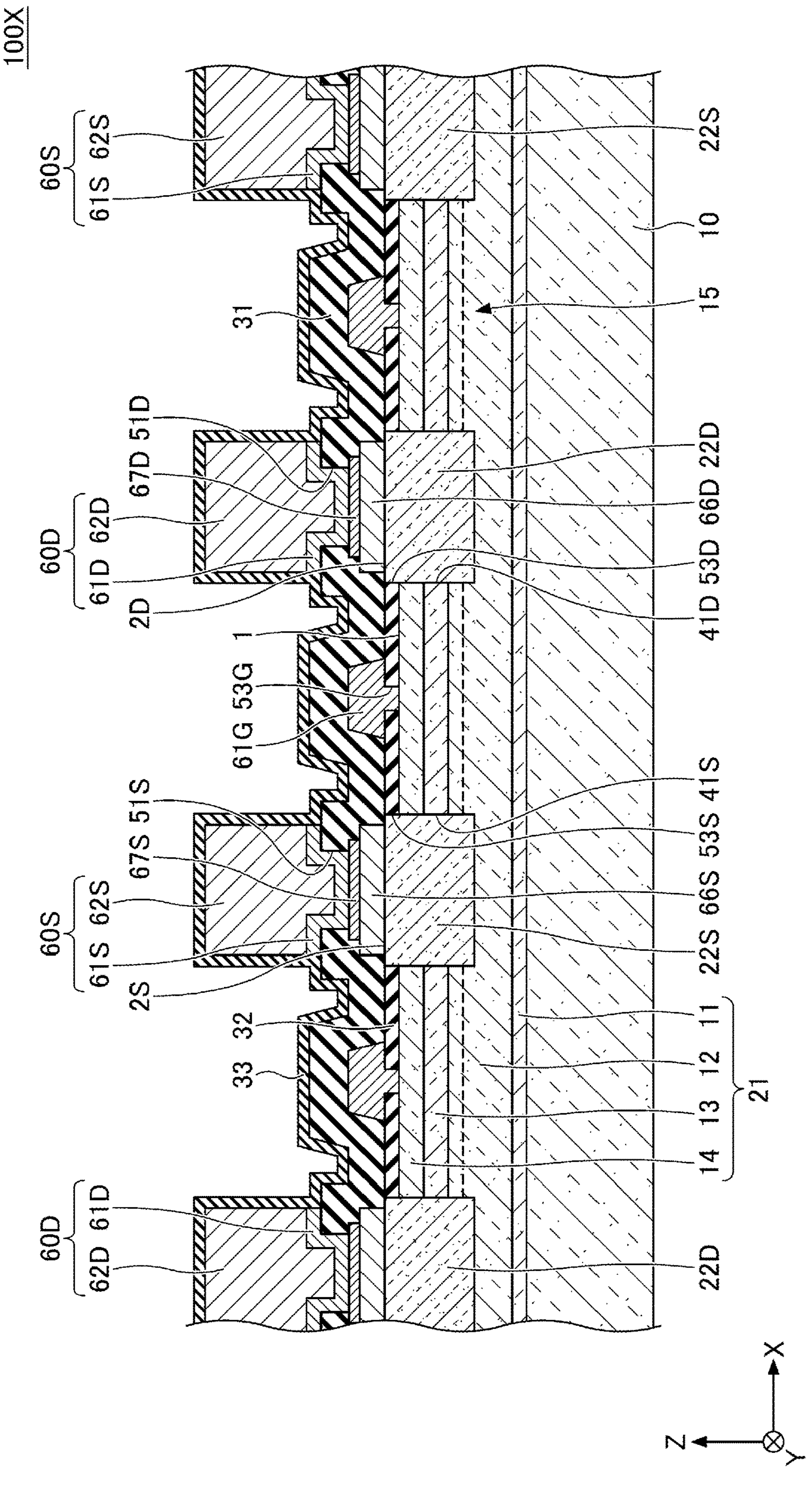
FIG. 15 is a cross sectional view illustrating the semiconductor device according to a reference example.

The reference example will be described as a comparative example for comparison with the embodiment. FIG. 14 is a diagram illustrating a layout of electrodes and pads in a semiconductor device according to the reference example. FIG. 15 is a cross sectional view illustrating the semiconductor device according to the reference example. FIG. 15 corresponds to a cross sectional view taken along a line XV-XV in FIG. 14. FIG. 14 and FIG. 15 are diagrams illustrating the reference example, and are not diagrams illustrating prior art.

As illustrated in FIG. 14 and FIG. 15, a semiconductor device 100X according to the reference example includes electrode layers 66S and 66D, and barrier metal layers 67S and 67D, in addition to the configuration of the semiconductor device 100.

The recess 42S is not formed in the second surface 2S of the semiconductor layer 22S, the electrode layer 66S is provided on the second surface 2S, and the barrier metal layer 67S is provided on the electrode layer 66S. In the plan view perpendicular to the first surface 1, an edge of the electrode layer 66S is inside an edge of the semiconductor layer 22S, and an edge of the barrier metal layer 67S is inside the edge of the electrode layer 66S. The recess 42D is not formed in the second surface 2D of the semiconductor layer 22D, the electrode layer 66D is provided on the second surface 2D, and the barrier metal layer 67D is provided on the electrode layer 66D. In the plan view perpendicular to the first surface 1, an edge of the electrode layer 66D is inside an edge of the semiconductor layer 22D, and an edge of the barrier metal layer 67D is inside the edge of the electrode layer 66D. The electrode layers 66S and 66D have a laminated film structure including a titanium (Ti) layer or a tantalum (Ta) layer, and an aluminum (Al) layer. The barrier metal layers 67S and 67D have a laminated film structure including a titanium (Ti) layer, a titanium tungsten (TiW) layer, a titanium nitride (TiN) layer, or a titanium tungsten nitride (TiWN) layer.

The insulating film 31 covers not only the gate electrodes 61G, the insulating film 32, the semiconductor layer 22S, and the semiconductor layers 22D, but also the electrode layer 66S, the electrode layer 66D, the barrier metal layer 67S, and the barrier metal layer 67D. The openings 51S reach the barrier metal layer 67S, and the openings 51D reach the barrier metal layer 67D.

As described above, in the semiconductor device 100X according to the reference example, the electrode layer 66S and the barrier metal layer 67S are provided between the semiconductor layer 22S and the interconnect layer 60S, and the electrode layer 66D and the barrier metal layer 67D are provided between the semiconductor layer 22D and the interconnect layer 60D. For this reason, a margin between the semiconductor layer 22S and the electrode layer 66S, a margin between the electrode layer 66S and the barrier metal layer 67S, and a margin between the barrier metal layer 67S and the interconnect layer 60S, are required between the semiconductor layer 22S and the interconnect layer 60S. Similarly, a margin between the semiconductor layer 22D and the electrode layer 66D, a margin between the electrode layer 66D and the barrier metal layer 67D, and a margin between the barrier metal layer 67D and the interconnect layer 60D, are required between the semiconductor layer 22D and the interconnect layer 60D.

According to the semiconductor device 100 according to the embodiment, the margin between the semiconductor layer 22S and the interconnect layer 60S, and the margin between the semiconductor layer 22D and the interconnect layer 60D, can be reduced compared to the semiconductor device 100X according to the reference example. For this reason, in the semiconductor device 100 according to the present embodiment, an interval between the gate electrodes 61G adjacent to each other in the X-axis direction can be reduced, and the size of the semiconductor device 100 can be reduced. In addition, because the semiconductor device 100 does not include the electrode layer 66S, the electrode layer 66D, the barrier metal layer 67S, and the barrier metal layer 67D, a contact resistance between different materials can be reduced.

Further, during the manufacturing process of the semiconductor device 100X, a heat treatment at a temperature in a range greater than or equal to 500° C. and less than or equal to 800° C. is performed after forming the electrode layers 66S and 66D, in order to ensure an ohmic contact between the electrode layer 66S and the semiconductor layer 22S, and an ohmic contact between the electrode layer 66D and the semiconductor layer 22D. During this heat treatment, Schottky characteristics of the gate electrodes 61G may vary. In contrast, during the manufacturing process of the semiconductor device 100, the heat treatment which may vary the Schottky characteristics of the gate electrodes 61G is not performed. Hence, according to the semiconductor device 100, stable characteristics can easily be obtained.

The interconnect layer 60S includes the seed layer 61S and the plating layer 62S, and the interconnect layer 60D includes the seed layer 61D and the plating layer 62D. The seed layers 61S and 61D provide an excellent adhesion between the insulating film 31 and the interconnect layers 60S and 60D. In addition, because the electrical resistance of the plating layers 62S and 62D is lower than the electrical resistance of the seed layers 61S and 61D, an excellent conductivity can easily be obtained in the interconnect layers 60S and 60D. In the case where the plating layers 62S and 62D are Au layers, a particularly excellent conductivity can easily be obtained.

The interconnect layer 60S includes the seed layer 61S and the plating layer 62S in a region where the interconnect layer 60S overlaps the opening 52S in the plan view perpendicular to the first surface 1. That is, the kind of the metal layer included in the local interconnect regions 71S and the kind of the metal layer included in the pad region 73S are the same. In addition, the interconnect layer 60D includes the seed layer 61D and the plating layer 62D in a region overlapping the opening 52D in the plan view perpendicular to the first surface 1. That is, the kind of the metal layer included in the local interconnect regions 71D and the kind of the metal layer included in the pad region 73D are the same. For this reason, the margin described above can easily be reduced.

Because the insulating film 32 is provided in addition to the insulating film 31, it is possible to easily protect the laminated structure 21 by the insulating film 32.

The electrical resistance of the semiconductor device 100 can easily be reduced, by making the carrier concentrations of the semiconductor layers 22S and 22D higher than the carrier concentration of the laminated structure 21. More particularly, the electrical resistance between the interconnect layer 60S and the interconnect layer 60D can easily be reduced. Further, the potential of the channel region included in the laminated structure 21 can be controlled by the gate electrode 61G.

The depth of the recesses 42S and 42D is not particularly limited. The depth of the recesses 42S and 42D is in a range greater than or equal to 5 nm and less than or equal to 50 nm, for example, and may be in a range greater than or equal to 10 nm and less than or equal to 40 nm. In a case where the depth of the recesses 42S and 42D is greater than or equal to 5 nm, the damaged layers 81S and 81D can easily be removed. In a case where the depth of the recesses 42S and 42D is greater than or equal to 10 nm, the damaged layers 81S and 81D can even more easily be removed. In a case where the depth of the recesses 42S and 42D is less than or equal to 50 nm, a processing time required to form the recesses 42S and 42D can easily be reduced. In a case where the depth of the recesses 42S and 42D is less than or equal to 40 nm, the processing time required to form the recesses 42S and 42D can even more easily be reduced.

The seed layers 61S and 61D may include, in addition to a lowermost Ti layer, a Au layer provided on the Ti layer. In addition, the seed layers 61S and 61D may include, in addition to the lowermost Ti layer, a titanium tungsten (TiW) layer, a Ti layer, and a Au layer successively provided on the Ti layer in this order. The plating layers 62S and 62D may include a copper (Cu) layer in place of the Au layer.

Moreover, the second metal layer does not necessarily have to be a plating layer, and the first metal layer does not necessarily have to be a seed layer. For example, the second metal layer may be formed by vapor deposition.

The configuration of the semiconductor layers included in the laminated structure 21 is not limited to that of the embodiment described above. For example, the barrier layer 13 may be provided between the channel layer 12 and the substrate 10. That is, a so-called inverted HEMT structure may be employed. Further, the cap layer 14 may be omitted, for example.

According to the present disclosure, it is possible to provide a semiconductor device having a size that can be reduced, and a method for manufacturing such a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a first nitride semiconductor layer having a first surface, and a first recess formed in the first surface;

a second nitride semiconductor layer provided inside the first recess;

a first insulating film, covering the first nitride semiconductor layer and the second nitride semiconductor layer, and having a first opening exposing at least a portion of the second nitride semiconductor layer; and an interconnect layer making ohmic contact with the second nitride semiconductor layer through the first opening, wherein:

the second nitride semiconductor layer has a second surface opposing the interconnect layer, a second recess, continuous with the first opening, is formed in the second surface, the interconnect layer makes direct contact with the second nitride semiconductor layer at an inner surface of the second recess, and the interconnect layer includes:

a first metal layer making direct contact with the second nitride semiconductor layer at a side surface and a bottom surface of the second recess, and a second metal layer, laminated on the first metal layer, and having an electrical resistance lower than an electrical resistance of the first metal layer.

2. The semiconductor device as claimed in claim 1, wherein the second metal layer is a gold layer.

3. The semiconductor device as claimed in claim 1, further comprising:

a passivation film, covering the interconnect layer, and having a second opening exposing a portion of the interconnect layer, wherein the interconnect layer includes the first metal layer and the second metal layer in a region overlapping the second opening in a plan view perpendicular to the first surface.

4. The semiconductor device as claimed in claim 1, wherein a carrier concentration in the second nitride semiconductor layer is higher than a carrier concentration in the first nitride semiconductor layer.

5. The semiconductor device as claimed in claim 1, wherein the second recess has a depth in a range greater than or equal to 5 nm and less than or equal to 50 nm.

6. The semiconductor device as claimed in claim 1, wherein the first opening exposes an entirety of the second surface from the first insulating film.

7. A semiconductor device comprising:

a first nitride semiconductor layer having a first surface, and a first recess formed in the first surface;

a second nitride semiconductor layer provided inside the first recess;

a first insulating film, covering the first nitride semiconductor layer and the second nitride semiconductor layer, and having a first opening exposing at least a portion of the second nitride semiconductor layer;

an interconnect layer making ohmic contact with the second nitride semiconductor layer through the first opening; and a second insulating film, provided between the first nitride semiconductor layer and the first insulating film, and having a third opening exposing the first recess, wherein:

the second nitride semiconductor layer has a second surface opposing the interconnect layer, a second recess, continuous with the first opening, is formed in the second surface, and the interconnect layer makes direct contact with the second nitride semiconductor layer at an inner surface of the second recess.

8. The semiconductor device as claimed in claim 7, wherein a carrier concentration in the second nitride semiconductor layer is higher than a carrier concentration in the first nitride semiconductor layer.

9. The semiconductor device as claimed in claim 7, wherein the second recess has a depth in a range greater than or equal to 5 nm and less than or equal to 50 nm.

10. The semiconductor device as claimed in claim 7, wherein the first opening exposes an entirety of the second surface from the first insulating film.

11. A semiconductor device comprising:

a first nitride semiconductor layer having a first surface, and a first recess formed in the first surface;

a second nitride semiconductor layer provided inside the first recess;

a first insulating film, covering the first nitride semiconductor layer and the second nitride semiconductor layer, and having a first opening exposing at least a portion of the second nitride semiconductor layer;

an interconnect layer making ohmic contact with the second nitride semiconductor layer through the first opening; and a gate electrode provided between the first nitride semiconductor layer and the first insulating film, wherein:

the second nitride semiconductor layer has a second surface opposing the interconnect layer, a second recess, continuous with the first opening, is formed in the second surface, and the interconnect layer makes direct contact with the second nitride semiconductor layer at an inner surface of the second recess.

12. The semiconductor device as claimed in claim 11, wherein a carrier concentration in the second nitride semiconductor layer is higher than a carrier concentration in the first nitride semiconductor layer.

13. The semiconductor device as claimed in claim 11, wherein the second recess has a depth in a range greater than or equal to 5 nm and less than or equal to 50 nm.

14. The semiconductor device as claimed in claim 11, wherein the first opening exposes an entirety of the second surface from the first insulating film.

* * * * *